(12) United States Patent
Skarman et al.

(10) Patent No.: US 6,678,509 B2
(45) Date of Patent: Jan. 13, 2004

(54) COMMUNICATION RECEIVER HAVING REDUCED DYNAMIC RANGE BY REDUCING THE FIXED RANGE OF THE AMPLIFIER AND INCREASING THE VARIABLE GAIN VIA A GAIN CONTROL CIRCUIT

(75) Inventors: Karin Skarman, Stockholm (SE); Tomas Stolt, Stockholm (JP); Anders Järleholm, Sollentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 180 days.

(21) Appl. No.: 09/977,573

(22) Filed: Oct. 15, 2001

(65) Prior Publication Data

US 2002/0068540 A1 Jun. 6, 2002

Related U.S. Application Data

(63) Continuation of application No. 09/220,521, filed on Dec. 24, 1998, now abandoned.

(51) Int. Cl.⁷ .................................................. H04B 1/06
(52) U.S. Cl. .................. 455/232.1; 455/522; 455/226.3
(58) Field of Search .......................... 455/127.1, 127.2, 455/127.3, 126, 561, 522, 226.1, 226.2, 226.3, 226.4, 115.1, 67.11, 67.12, 232.1

(56) References Cited

U.S. PATENT DOCUMENTS

| | | | |
|---|---|---|---|
| 4,485,486 A | 11/1984 | Webb et al. | |
| 4,580,262 A | 4/1986 | Naylor et al. | |
| 4,811,421 A | 3/1989 | Havel et al. | |
| 5,241,702 A | 8/1993 | Dent | |
| 5,265,119 A | 11/1993 | Gilhousen | |
| 5,469,115 A * | 11/1995 | Peterzell et al. | ............ 330/129 |
| 5,530,929 A | 6/1996 | Lindqvist | |
| 5,568,520 A | 10/1996 | Lindqvist | |
| 5,572,221 A | 11/1996 | Marlevi et al. | |
| 5,574,982 A | 11/1996 | Almgren et al. | |
| 5,579,347 A | 11/1996 | Lindqvist et al. | |
| 5,603,113 A | 2/1997 | DeLoe, Jr. | |
| 5,627,857 A | 5/1997 | Wilson | |
| 5,655,220 A | 8/1997 | Weiland et al. | |
| 5,768,307 A | 6/1998 | Schramm | |
| 5,838,735 A | 11/1998 | Khullar | |
| 5,999,578 A | 12/1999 | Ha | |
| 6,075,991 A * | 6/2000 | Raleigh et al. | ............ 455/450 |
| 6,078,798 A | 6/2000 | Kobayashi | |
| 6,081,564 A * | 6/2000 | Han | ............ 375/345 |
| 6,212,244 B1 * | 4/2001 | Davidovici et al. | ......... 375/345 |
| 6,259,927 B1 | 7/2001 | Butovitsch et al. | |

FOREIGN PATENT DOCUMENTS

| | | |
|---|---|---|
| EP | 371 700 A | 6/1990 |
| EP | 455388 A | 11/1991 |
| EP | 725 479 A | 8/1996 |

* cited by examiner

*Primary Examiner*—Nay Maung
*Assistant Examiner*—Nick Corsaro

(57) ABSTRACT

An apparatus for use in a receiver in a communication system in which signals cover a wide range of power levels. The apparatus provides reduced power consumption without sacrificing receiver sensitivity by using an amplifier having a fixed, relatively narrow dynamic range that can by selectively positioned to accommodate the wide range of power levels. The amplifier is placed earlier in the receiver signal processing chain than comparable amplifiers in conventional receivers.

25 Claims, 6 Drawing Sheets

COMMUNICATION RECEIVER HAVING REDUCED DYNAMIC RANGE BY REDUCING THE FIXED RANGE OF THE AMPLIFIER AND INCREASING THE VARIABLE GAIN VIA A GAIN CONTROL CIRCUIT

This application is a continuation of application Ser. No. 09/220,521, filed on Dec. 24, 1998 now abandoned.

BACKGROUND

This application relates to telecommunications and more particularly to radio communication systems in which distances between transmitters and receivers can vary.

In a communication system in which the ranges between transmitters and receivers can vary, the effective sensitivity of a receiver can be reduced by high-power transmissions from nearby transmitters. The receiver's effective sensitivity is the minimum received signal strength (RSS) that permits the received signal to be processed successfully. For example in a cellular radio telephone communication system, the effective sensitivity of a base station to signals from a mobile station can be reduced (i.e., the minimum RSS can be increased) in the presence of strong signals from mobile stations on other frequencies or channels (adjacent-channel interference) and/or on the same frequency or channel (co-channel interference).

Such sensitivity reduction can result from many causes in the receiver, including intermodulation products generated during radio signal downconversion and demodulation that increase the probability of errors at the base station and the potential for dropped connections. The effects of signal distortions like intermodulation products are sometimes handled by suitable digital processing, as described for example in U.S. Pat. No. 5,768,307 to Schramm et al.

A reduction of the sensitivity of a receiver such as a base station will have its strongest effect on distant mobile stations since the received signal strengths of those mobile stations are likely to be close to the base station receiver's sensitivity. Such problems caused by signals being received at widely varying power levels are particularly acute in multi-layer, or hierarchical, cellular systems, in which large macrocells overlie smaller microcells that may themselves overlie even smaller picocells. Such systems are known in the art, for example U.S. Pat. No. 5,572,221 to Marlevi et al., which is incorporated here by reference. Such multi-layer systems make it more likely that a transmitter that causes a disturbance is not under the control of a cell in which the disturbance occurs. These problems also occur in areas covered by overlapping communication systems controlled by independent operators.

At the same time that a receiver must have good sensitivity, enabling it to handle low-power signals, the receiver should be able to handle high-power signals without distortion or overloading. The result of the simultaneous requirements for good sensitivity and high-power signal handling is that the receiver should have a wide dynamic range. This is usually achieved in current communication systems by arranging the amplifiers and other components of the receiver to provide a total input dynamic range on the order of 120 dB, which is usually obtained in two steps: a fixed component of about 100 dB and a variable-gain component of about 20 dB. The variable-gain range is usually provided by an amplifier whose gain can be controllably varied through the 20 dB range, and such an amplifier is usually disposed in an automatic gain control (AGC) loop.

The general arrangement of such a receiver is illustrated by FIG. 1, which shows an antenna 1 that provides a signal to a downconverter 2. As its name suggests, the downconverter shifts the signal received by the antenna to lower frequencies that are more conveniently handled. The downconverted signal is appropriately shaped by bandpass filter 3 and amplifier 4, which usually has an adjustable gain. The gain of the amplifier 4 is automatically controlled by an AGC detector and associated circuitry 5 based on feedback of a portion of the amplified downconverted signal, which in modern receivers is usually provided to an analog to digital converter 6 and further processing components. A main purpose of the AGC is to maintain the signal at a level that can be usefully handled by the analog to digital converter. This form of receiver having AGC is common in the art, as illustrated for example by FIG. 5 of U.S. Pat. No. 5,265,119 that also shows use of the feedback signal for controlling the power level of a transmitted signal.

To help limit the dynamic range requirement and deal with other problems not relevant to this application, current cellular systems, which are illustrated by FIG. 2, control the power levels of the various transmitters in the systems. In FIG. 2, a plurality of cells C1–C10 include respective base stations B1–B10 that transmit signals to mobile stations M1–M9. The base stations B1–B10 are connected to a mobile services switching center MSC that is the interface between the cellular system and another communication system (not shown) like a public switched telephone network (PSTN).

Power control as described in U.S. Pat. No. 4,485,486 to Webb et al. involves the base station's measuring the strength of signals received from the mobile station, comparing the received signal strength with upper and lower thresholds that indicate a desired range for proper reception, and issuing a power adjustment order to the mobile station based on the comparison.

In U.S. Pat. No. 4,811,421 to Havel et al., the mobile station determines its transmission power level such that the strength of the signal received by the base station will be constant. The determination is based on strength measurements of the signal received by the mobile station that are used to estimate the path loss to the base station.

In U.S. Pat. No. 4,580,262 to Naylor et al., the output power of a transmitter is controlled by the receiver such that the output power is just enough for the communication link to have sufficient quality. The quality target is fixed, however, and thus the system suffers from a "party effect", by which all transmitters tend to increase their power levels. U.S. Pat. No. 5,574,982 to Almgren et al. describes a communication system having quality-based transmit power control that is not subject to the "party effect" but that still maximizes the carrier to interference (C/I) ratio. The Almgren patent is expressly incorporated here by reference. U.S. patent application Ser. No. 08/870,867 filed on Jun. 6, 1997, by Butovitsch et al. for "transmit Power Control in a Radio Communication System" is also expressly incorporated here by reference.

In quality-based transmit power control, the receiver determines the interference level based on a received signal quality measurement such as bit error rate (BER), frame error rate, etc. Generally this is done by comparing received versions of a predetermined signal to the expected predetermined signal and then counting deviations. For example, in a time division multiple access (TDMA) radio telephone system such as that specified by the EIA/TIA IS-54-B standard, the receiver compares a received synchronization word (SYNC) and/or a digital verification color code (DVCC) to the known SYNC or DVCC and counts the erroneous received values as a function of time. The measured received signal quality is used to generate commands that the receiver sends to the transmitter for adjusting the transmitter's power level and thereby adjusting the received signal quality. Such adjustments are possible, however, only for transmitters that are coordinated by the cell, e.g., mobile stations that are controlled by the cell served by the (base station) receiver (e.g., mobile stations registered in the cell).

Besides these power control considerations, base stations are also subject to physical-size constraints, particularly base stations that are used in small cells, such as indoor systems. In order to build a base station that is physically small, the power consumption of the base station generally has to be small. Since the power consumed by a base station is proportional to, among other things, the dynamic range of the base station receiver, decreasing the dynamic range of the base station receiver is a way to decrease the power consumption of the base station.

The dynamic range of an amplifier determines how much the input signals to the amplifier may vary in amplitude. One way to decrease the dynamic range of a receiver is to decrease the fixed dynamic range of the variable-gain amplifier. For instance, an amplifier handling signals that can be spread in amplitude over a range of 40 dB typically consumes less power than an amplifier handling signals that can range over 100 dB, which is the range usually employed by receivers in cellular telephone systems as noted above.

As noted above, it is generally desirable in a communication system in which signals have different power levels to use a receiver having a wide dynamic range but the problem is that a high dynamic range implies a high power consumption, which in turn implies large physical size for cooling. Although reducing the dynamic range is one approach to this problem, a receiver having a reduced dynamic range suffers other problems. If the dynamic range is set to handle low-strength signals, then the receiver cannot handle high-strength signals. If the dynamic range is set to handle high-strength signals, then the receiver cannot handle low-strength signals.

One solution to this dilemma that is used in prior communication systems is to use AGC in a receiver with a reduced fixed dynamic range. The AGC is provided by an amplifier having variable gain. Nevertheless, this solution does not permit weak and strong signals to be handled simultaneously, which is important because some received signals may emanate from transmitters that are coordinated by the communication system (cell) and other received signals may emanate from transmitters that are not coordinated by the system, as noted above.

What is needed is a receiver that has a reduced dynamic range and that is still able to cope with all signals within its band, even signals from transmitters that are not coordinated by the system of which the receiver is a part. Such a receiver can be used in a communication network employing quality-based transmit power control to provide a system capable of achieving an optimal C/I ratio for all connections.

SUMMARY

The present invention provides a receiver that combines being operable in a full input dynamic range with a smaller physical size and lower electric power consumption than prior receivers. Such a receiver is ideally suited for indoor cellular radio communication systems, among many other uses. In general, these advantages are provided by reducing the fixed component of the dynamic range and increasing the variable-gain component of the dynamic range.

In an exemplary embodiment of the invention, there is provided an apparatus in a receiver in a communication system, in which a transmitter in the communication system has a transmit power level that is controlled based on at least one signal received by the receiver. The apparatus includes an amplifier having a fixed dynamic range that is substantially less than 100 dB, an analog to digital (A/D) converter, and a gain control unit. The fixed dynamic range of the amplifier is selectively positioned in a range of at least about 80 dB in response to a feedback control signal from the gain control unit. Further, the transmit power level of one or more desired signals received by the apparatus is controlled based on the received signals.

In another aspect of the invention, a method of processing signals in a receiver in a base station in a cellular radio telephone system having a plurality of mobile stations is provided. The method includes the steps of receiving the signals, which include at least one desired signal may include at least one interfering signal, amplifying the signals with an amplifier that has a fixed dynamic range substantially less than 100 dB, and controlling a transmit power level of the at least one desired signal received at the base station based on power levels of the received signals. During the step of amplifying, the position of the dynamic range of the amplifier is selectively controlled.

In yet another aspect, in a cellular radio telephone system having a base station and a plurality of mobile stations, a method of processing received signals in the base station comprises the steps of: receiving a signal from a mobile station operating in a transmit power control loop that includes a receiver in the base station; receiving a disturbing signal from another radio transmitter having a transmit power level that is not coordinated with a transmit power level of the mobile station; moving a dynamic range of the receiver in a manner that accounts for the disturbing signal; and adjusting a transmit power level of the mobile station to maintain an acceptable received signal quality.

In yet a further aspect of the invention, there is provided a communication system that includes a receiver having a fixed dynamic range that is substantially less than 100 dB; at least one transmitter that sends a desired communication signal to the receiver; a gain control unit in the receiver that selectively moves the dynamic range when at least one of a level of the at least one desired communication signal at the receiver and a level of at least one other communication signal at the receiver is out of the fixed dynamic range of the receiver; and a device for controlling a transmit power level of the at least one desired communication signal based on power levels of the at least one desired communication signal and the at least one other communication signal at the receiver.

BRIEF DESCRIPTION OF THE DRAWINGS

The features and advantages of applicant's invention will be understood from reading this description in conjunction with the accompanying drawings, in which.

DETAILED DESCRIPTION

The following description is given in the context of a receiver in a base station in a cellular radio telephone system. It will be understood, however, that Applicants' invention is not limited to this context, but is generally applicable to systems employing quality-based transmit power control and receivers having variable-gain amplifiers that determine the receivers' overall dynamic ranges. Applicants' invention provides a way to deal with signals at different power levels in a communication system without sacrificing sensitivity.

Figure 3:
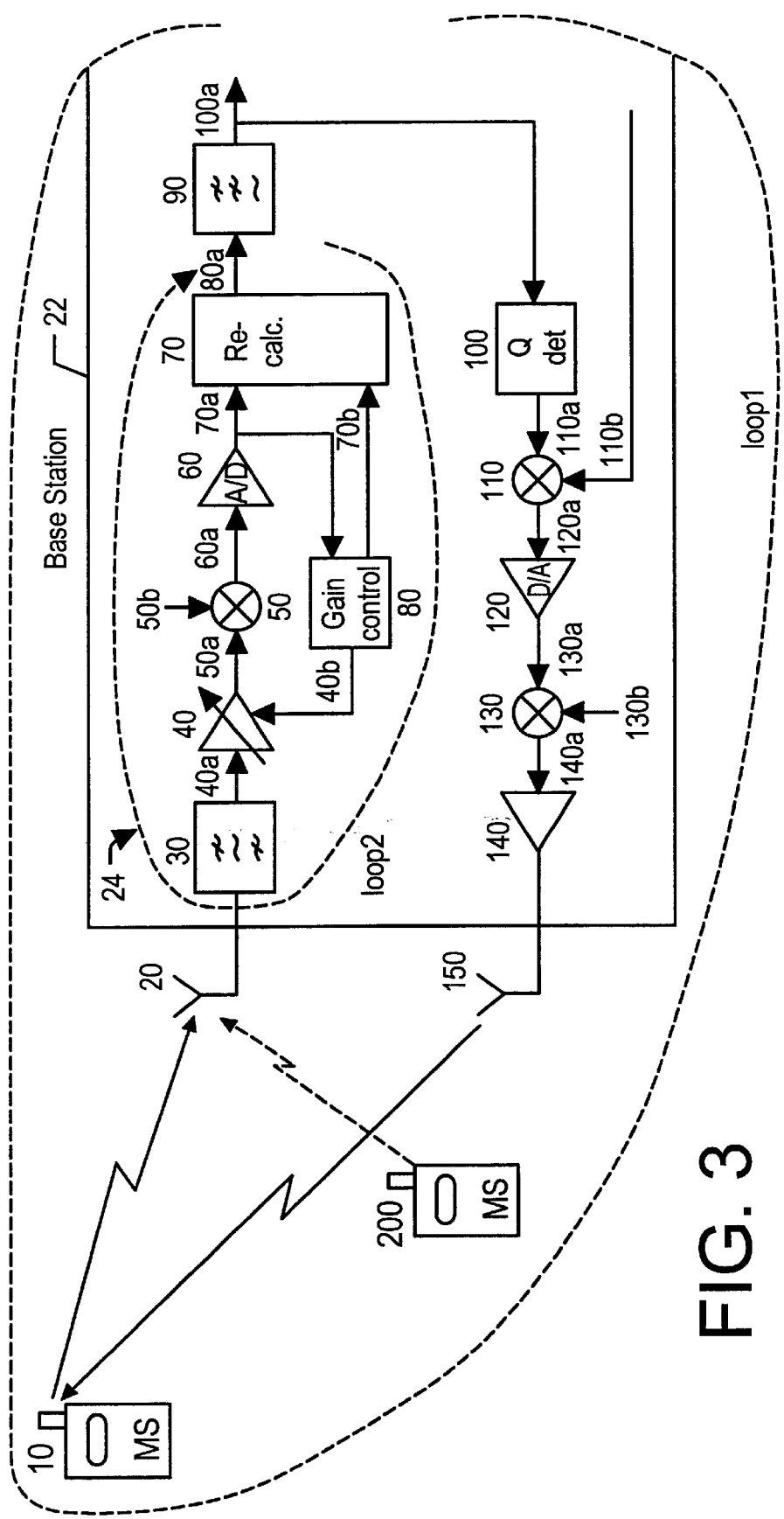
FIG. 3 illustrates an exemplary embodiment of Applicants' invention.

FIG. 3 illustrates a portion of a communication system, in which an antenna 20 provides a signal to a base station 22 having a receiver 24 including a bandpass filter 30 and an amplifier 40 having variable gain. The filter 30 produces a filtered received signal 40a that is provided to the variable-gain amplifier 40. The signal received by the antenna 20 is typically a superposition of a signal or signals of interest, e.g., from a mobile station (MS) 10, and interfering signals, e.g., from an MS 200, that may reach the antenna at a higher or lower power level.

The signal 50a produced by the amplifier 40 is provided to a mixer 50, which also receives a local oscillator signal 50b, and the mixer 50 translates the frequency of the signal 50a from the portion of the spectrum passed by the bandpass filter 30 to a more convenient portion of the spectrum like baseband. The signal 60a produced by the mixer 50 is then digitized by an analog-to-digital (A/D) converter 60, and the digital signal 70a produced by the A/D converter 60 is further processed by a recalculation unit 70 and a gain control unit 80.

General aspects of this kind of direct-conversion are known in the art, which includes U.S. Pat. No. 5,838,735 to Khullar; U.S. Pat. No. 5,579,347 to Lindquist et al.; U.S. Pat. No. 5,568,520 to Lindquist et al.; U.S. Pat. No. 5,530,929 to Lindqvist; and U.S. Pat. No. 5,241,702 to Dent.

As noted above, Applicants' invention provides a receiver that combines being operable in a full input dynamic range with a smaller physical size and lower electric power consumption than prior receivers by reducing the fixed component of the receiver's dynamic range and increasing the variable-gain component of the receivers dynamic range. When a desired signal or signals is received at a level that is outside the receiver's current dynamic range (as determined by, among other things, the setting of the variable gain), the gain is adjusted such that the receiver's dynamic range is able to cope with the received signal. This may require adjustment of the transmission power level of a transmitter, the received signal of which was within the formerly set dynamic range of the receiver, in order to avoid losing communication with that transmitter.

In FIG. 3, the variable-gain component of the dynamic range is the variable gain range of the amplifier 40 that is responsive to a gain control level 40b generated by a gain control unit 80 that is used to control or change the position of the dynamic range of the amplifier 40 such that the signal produced by the amplifier 40 is maintained within a desired operating range. The gain control unit 80 produces the gain control level 40b based on the digital signal 70a, for example by comparing the amplitude of the signal 70a to a reference level.

To avoid competition between the receiver's AGC and the communication system's transmission power control, the recalculation unit 70 reconstitutes for the purpose of transmission power control the signal originally received (e.g., the signal 40a), which it can be seen is not directly available from the signal 70a due to the AGC provided by the combination of the gain control unit 80 and the variable-gain amplifier 40. The dashed line identified as loop 2 indicates the AGC loop in the receiver. The recalculation unit 70 determines the level of the signal originally received, producing a signal 80a, based on a gain control value 70b provided by the gain control unit 80 and on the baseband signal 70a from the A/D converter 70 according to the following formula:

$$\text{output signal } 80a = 10^{(\log(\text{signal } 70a) + \text{gain control value } 70b)}$$

The output signal 80a produced by the recalculation unit 80 is passed through a low-pass filter 90, which produces an output signal 100a that is distributed to the further base band processing components (not shown) of the receiver.

The level of the signal as originally received is also used by the further base band processing components for developing reports needed by the MSC for various purposes, e.g., determining whether handover of responsibility for a mobile station from one base station to another is necessary. Although not strictly necessary for quality-based transmit power control, knowledge of the original received signal level can be helpful for that purpose, too.

In order to implement quality-based transmission power control, the signal 100a is also provided to a quality detector 100, which monitors the quality of the communication link, e.g., by measuring the BER, C/I, burst quality, or the like. The dashed line identified as loop 1 indicates the transmission power control loop in the communication system. As mentioned above, transmission power control tends to keep the transmit power of MS 10 at a minimum, thereby saving the mobile's battery and decreasing interference with other system users. The quality measured by the quality detector 100 is a basis of command signals 110a that are added by a suitable combiner 110 to other communication information 100b that is to be transmitted to the MS 10. The combined signal 120a is converted from digital form to analog form by a digital-to-analog (D/A) converter 120, upconverted to a frequency suitable for transmission by a mixer 130 that receives a local oscillator signal 130b, amplified for transmission by a power amplifier 140, and then fed to a transmitting antenna 150 for communication to the MS 10.

Figure 1:
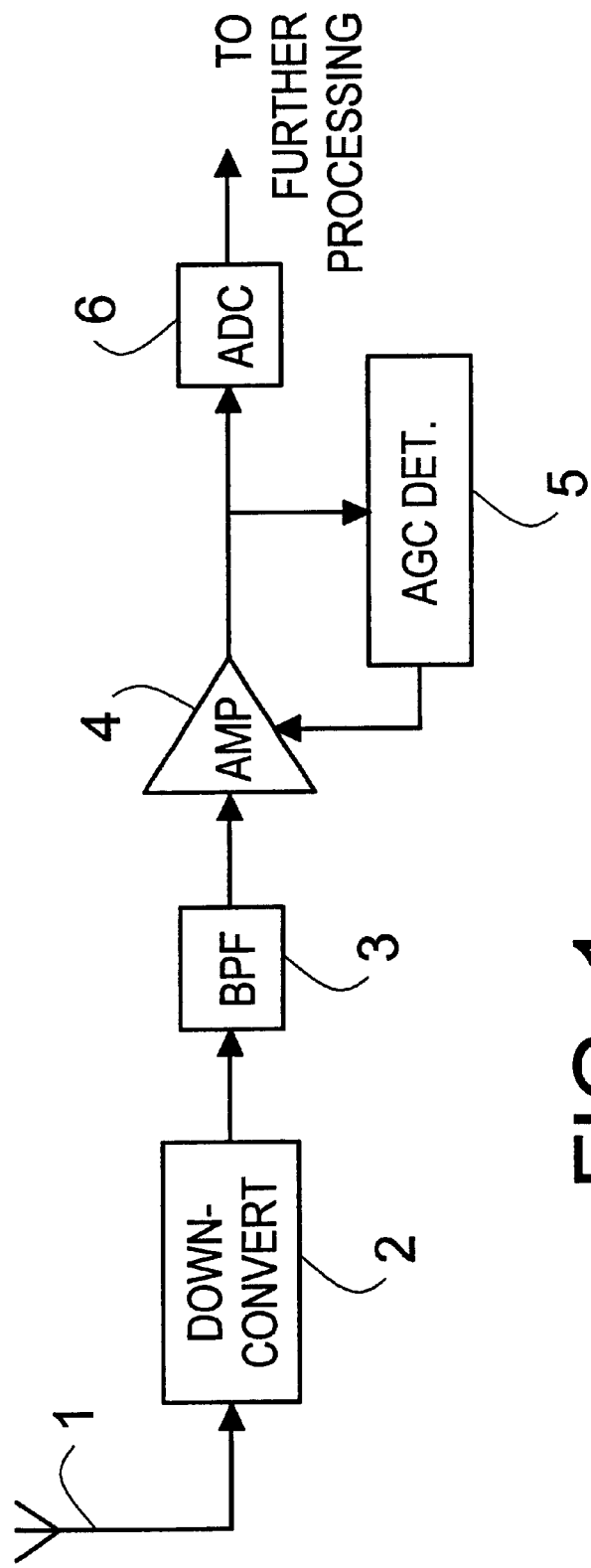
FIG. 1 shows the general arrangement of a receiver in a communication system.
Figure 2:
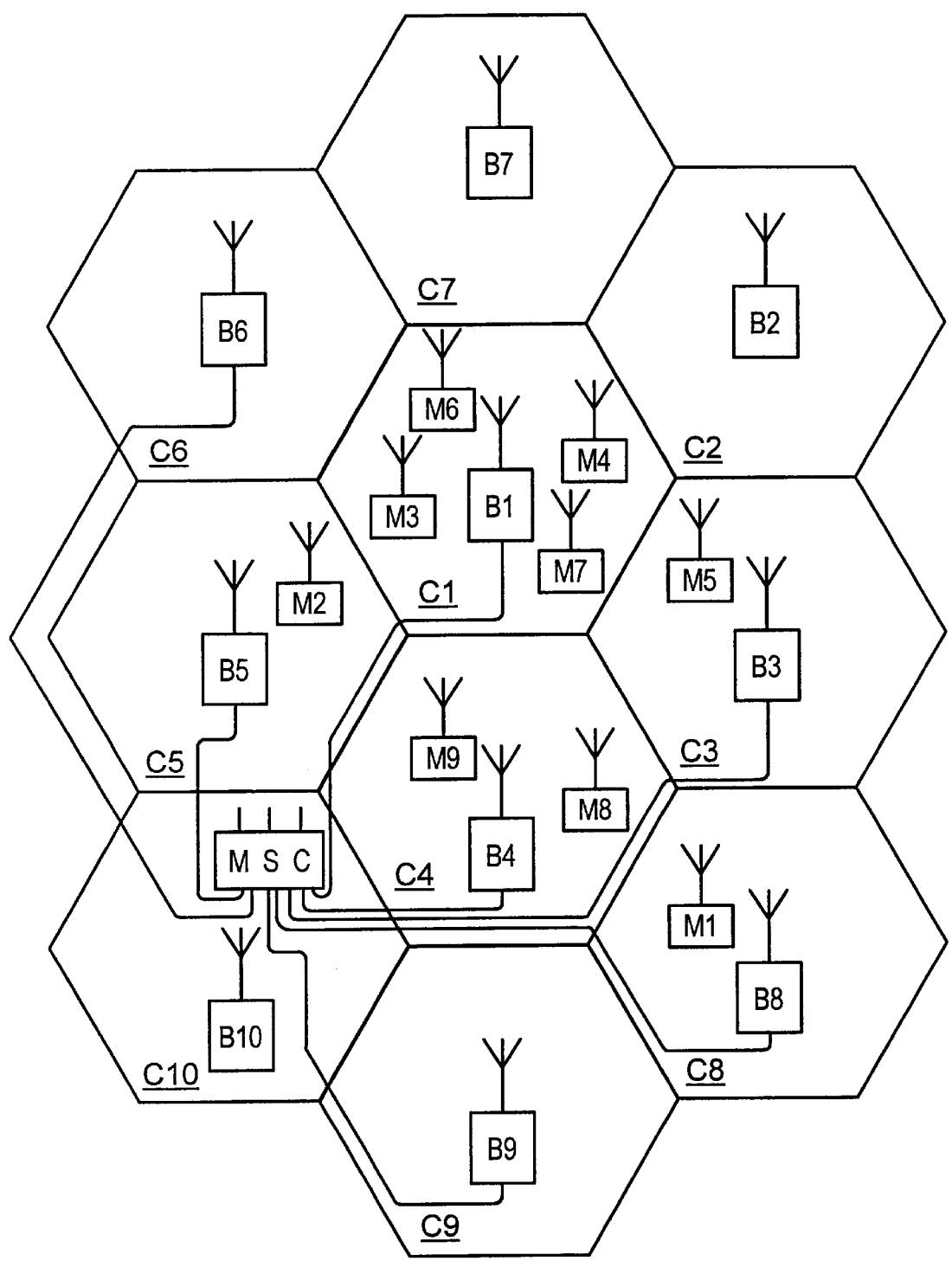
FIG. 2 illustrates the general organization of a cellular communication system.

As noted above, the dynamic range of the counterpart of the amplifier 40 in a conventional radio telephone receiver (i.e., amplifier 4 in FIG. 1) is usually large, at least about 100 dB, and the amplifier has a gain that is adjustable over a range that is small, only about 20 dB. Such a large dynamic range generally increases the size and power consumption of the receiver, which is a problem when it is desired to have a small receiver. In accordance with one aspect of Applicants' invention, the fixed component of the dynamic range of the amplifier 40 is only about 40 dB, much smaller than that of a conventional amplifier, and the gain of the amplifier 40 is variable over a much larger range, e.g., about 80 dB. When the sensitivity of a receiver using such an amplifier is to be reduced, the reduction is compensated for a desired transmitter by increasing the transmit power level of the transmitter so that the communication link to that transmitter is not lost as described in more detail below.

Figure 4:
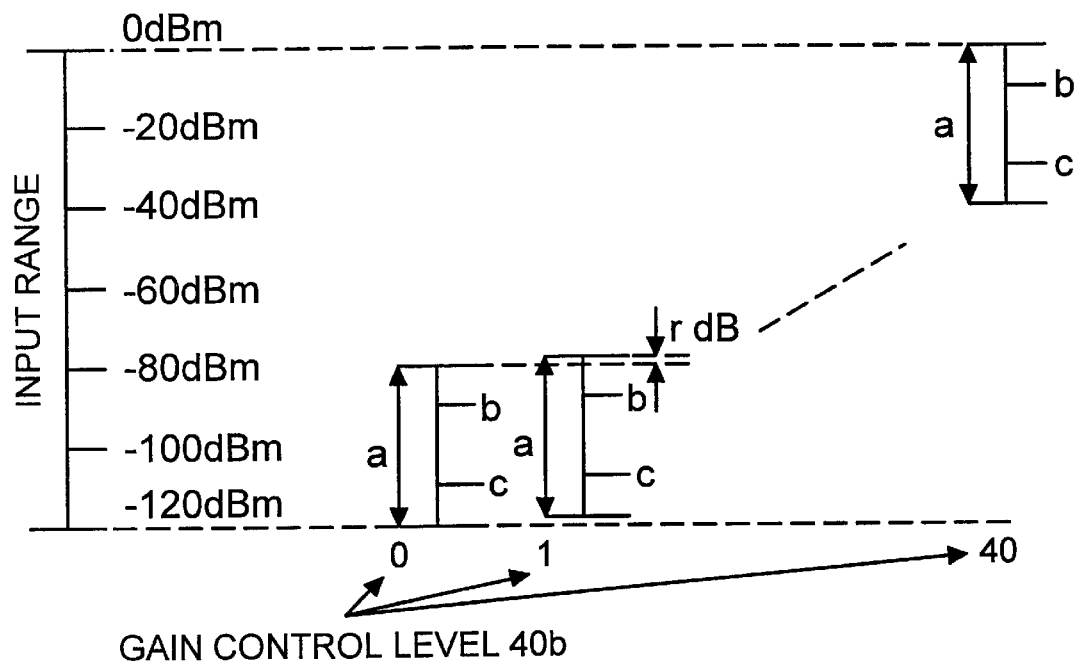
FIG. 4 illustrates a movable dynamic range in accordance with one aspect of Applicants' invention.

FIG. 4 illustrates how the fixed component of the dynamic range can be positioned in order to cover an exemplary input signal range of 120 dB. On an absolute basis, those received signals may cover −120 dBm to 0 dBm, but it will be understood that the actual power levels will depend on the communication system. As illustrated in FIG. 4, the 40-dB fixed dynamic range "a" of the amplifier 40 may be initially positioned in the range between −120 dB and −80 dB, yielding the greatest receiver sensitivity. This corresponds to a first (minimal) gain control level 40b, e.g., zero as indicated in the figure, from the gain control unit 80. As the gain control level 40b takes on other values, the range of the amplifier 40 is positioned at other places in the overall input range. For example, when the gain control level 40b has the minimal value plus a minimal increment, the dynamic range of the amplifier 40 is moved up a predetermined increment r dB in the overall input range, and when the gain control level 40b has a second (maximal) value, e.g., forty, the dynamic range of the amplifier 40 is moved up to the top of the overall input range. In this way, the small fixed dynamic range of the amplifier 40 can cover the entire input range.

As noted above, the gain control level 40b is based on the signal 70a from the A/D converter 70. When that signal has been above an upper threshold "b" (shown in FIG. 4) for more than a first number u of digital samples, the gain control level 40b is increased by the increment r dB. In a similar way, the gain control level 40b is decreased by the increment r dB when the level of the signal 70a has been below a lower threshold "c" for more than a second number k of digital samples. It will be appreciated that the first and second numbers u, k may be the same or not. The range increment r dB can be small or large, depending on whether the communication system needs fine or coarse adjusting, respectively.

Figure 5:
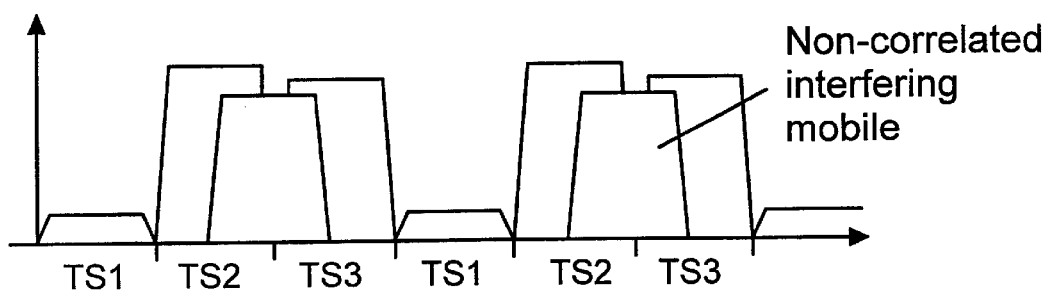
FIG. 5 illustrates signals in a TDMA system that uses frames of three time slots each.

The factors that influence the values of the first number u, the second number k, and the increment r, and the thresholds for that matter, depend on the communication system. FIG. 5 is an example of signals in a TDMA system that uses frames each comprising three time slots TS1, TS2, TS3 that may be used for communicating with different mobile stations. In FIG. 5, the signals in time slots TS2 and TS3 are disturbed by an interfering signal that is not part of the three-slot frame structure, i.e., the interfering signal is from a transmitter that is not coordinated by the communication system with the slot signals. As a result, the users of slots TS2 and TS3 are ordered by the base station to change their transmission power level to maintain (or restore) acceptable levels of signal quality. The user of time slot TSI is not disturbed by the interfering signal, and thus is not ordered to increase its transmission power level.

Due to the different received signal strengths of the three users, the dynamic range of the base station receiver may have to be moved. In the worst case situation, the receiver dynamic range must be moved 80 dB as the mobiles' transmission power levels are commanded up or down. In some communication systems, the duration of a transmission power ramp up or down is specified, for example a duration of sixteen digital samples. In such a system if the numbers u, k are both set to one, then the range increment r should be set to 5 dB. With these settings, the dynamic range is moved 5 dB per digital sample or 80 dB per sixteen samples (the specified power ramp duration). Other combinations of settings are possible, of course, within the constraint that the dynamic range has to be moved to track the received signal strength input to the receiver.

In an otherwise typical cellular system, the receiver can advantageously employ an amplifier having a dynamic range of 40 dB and a range increment of 5 dB, making it possible to cover a 120-dB overall input range with a 7-bit A/D converter 60. This is a significant improvement over a conventional receiver that needs a 17-bit A/D converter to cover that overall input range. Besides the power saving realized by the 40-dB-range amplifier in comparison to the conventional 100-dB-range amplifier, further power saving results from using the smaller-range A/D converter. Of course it will be recognized that a 7-bit A/D converter is just an example and that other converters may be used according to the particular application.

In an additional aspect of Applicants' invention, the reduced-variable-gain-range amplifier is placed very early in the receiver signal processing chain, at a position where reduced range usually means reduced sensitivity. Nevertheless, the reduced sensitivity of a receiver using such an amplifier is compensated by increasing the transmit power level of a transmitter so that the communication link to that transmitter is not lost as described in more detail below. In another aspect of Applicants' invention, the AGC loop 2 includes the A/D converter 60, thereby enabling converter imperfections to be compensated.

The advantageous aspects of a communication system employing Applicants' invention can be explained in connection with FIGS. 6A, 6B, 6C, which show the position of the receiver's dynamic range relative to signal strengths of a desired mobile station MS 10 and an interfering mobile station MS 200 for three common situations.

In these figures, the loop 1 (see FIG. 3) works to adjust the transmission power level of the desired mobile station MS 10 so that the strength of the signal received from MS 10 falls within the dynamic range of the base station receiver and the loop 2 (see FIG. 3) works to change the position of the receiver's dynamic range.

Figure 6:
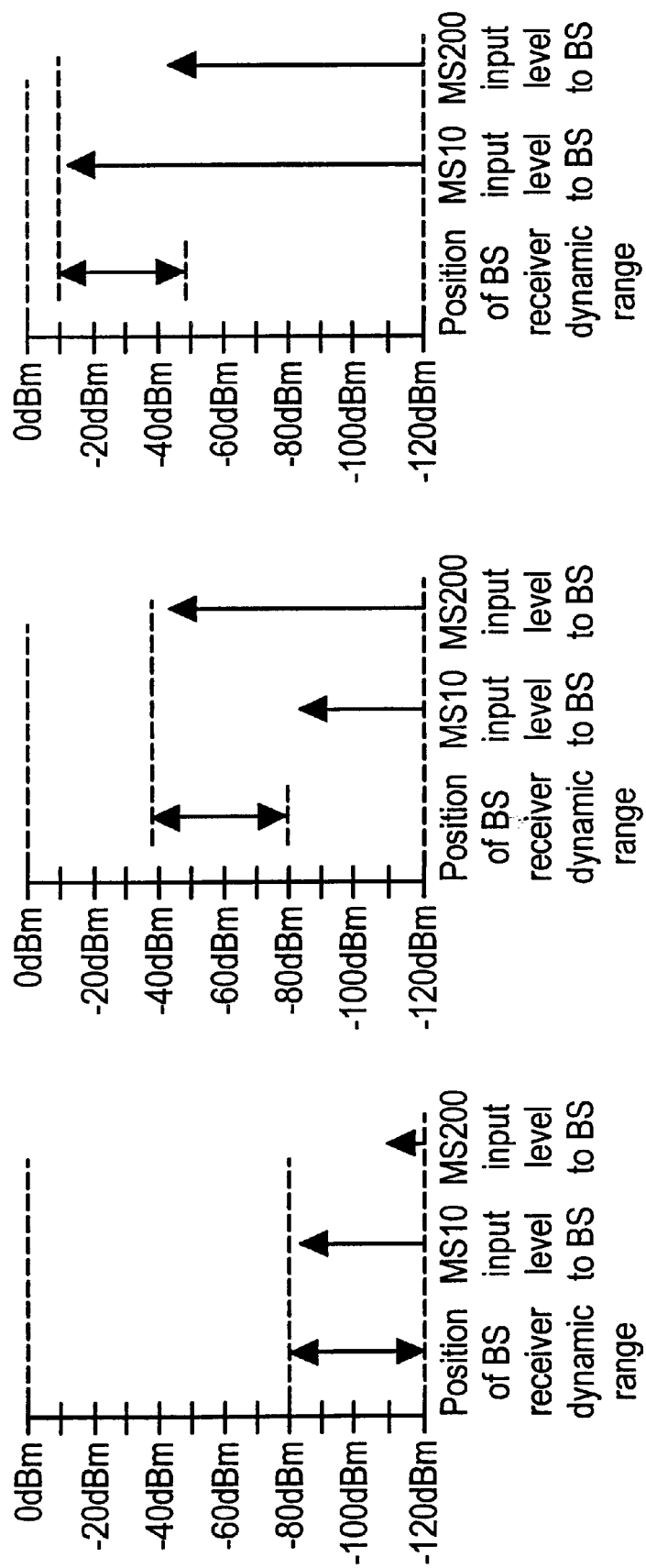
FIGS. 6A, 6B, 6C illustrate a receiver's dynamic range relative to signal strengths of a desired transmitter and an interfering transmitter for three situations.

In FIG. 6A, both signal strengths are low, with the desired signal being sufficient relative to the interfering signal so that signal processing is not adversely affected. In this situation, the dynamic range is positioned at the minimal level (highest sensitivity). This position can be maintained for a wide range of desired and interfering signal strengths.

FIG. 6B illustrates the situation where the signal strength of the desired station MS 10 has not increased and the signal strength of the interfering station MS 200 has changed in that the disturbance has increased dramatically, e.g., 80 dB relative to FIG. 6A. It will be understood that the disturbance can change in general by decreasing or increasing, with an increase being due for example to movement of the interfering mobile station towards the receiver. Accordingly, the dynamic range is moved to a position that avoids saturating the receiver, e.g., a position that is not out of the range of the A/D converter. In FIG. 6B, this position can accommodate both the desired and interfering signals without commanding the desired mobile station MS 10 to increase its transmission power level. In the new position of the dynamic range, it is also possible in general for the strength of the desired signal to fall below the minimum of the dynamic range. Moreover, it is also possible that the desired and disturbing signal strengths are such that it is not necessary to move the position of the dynamic range. In any of these events, the signal quality detector may notice a decrease in the quality of the signal received from the desired mobile station MS 10.

Accordingly as illustrated in FIG. 6C, the desired mobile station MS 10 is commanded to increase its transmission power level based on the signal quality measurement. Increasing the transmission power level may require the dynamic range to be moved (upwards, in this example) until an acceptable signal quality measurement is obtained. It will be understood that the desired mobile station must have some "headroom" in its transmission power level that permits an increase if commanded, which affects the size of the cells in which Applicants' system is useful since the desired mobile station may be located at the periphery of a cell and since the mobile station maximal transmission power level is finite. Thus, Applicants' system is likely to be especially useful for systems having small cells.

These steps of moving the dynamic range and commanding a change in the transmission power level of a desired signal or signals may be repeated as necessary to obtain an acceptable operating condition. Moreover, it will be noted that the transmission power level of a desired signal is adjusted based on power levels of that signal and other signals that fall within the range of the receiver.

Figure 7:
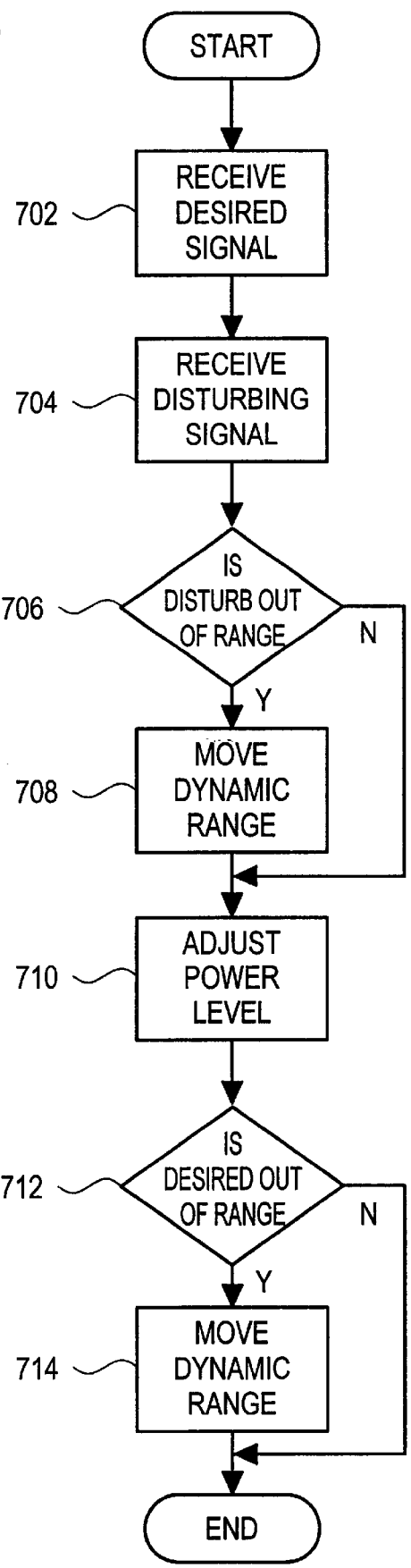
FIG. 7 is a flow chart of the steps of a method in accordance with Applicants' invention.

A flow chart of the steps of a method in accordance with Applicants' invention is depicted in FIG. 7. The method begins in step 702 with receiving a signal from a transmitter, such as a mobile station, operating in a transmit power control loop that includes the receiver, such as a base station. In response to a disturbance (step 704) such as receiving a signal from another transmitter, it is determined (step 706) whether the disturbing signal is out of the receiver's range. If so, the dynamic range of the receiver is moved (step 708) in a manner that accounts for the disturbance. If not or in the next step (step 710), the transmit power level of the transmitter is adjusted if necessary to maintain an acceptable received signal quality, and then (step 712) it is determined whether the desired signal is out of the receiver's range. If so, the dynamic range of the receiver is moved (step 714) in a manner that accounts for the new transmit power level of the desired transmitter.

The preceding description has generally not focussed on many characteristics of the desired signal or signals from the mobile station(s) merely for reasons of simplicity. For example, it will be understood that Applicants' invention encompasses a receiver for simultaneously receiving one or more desired communication channels or signals. One example of such a receiver is the receivers that handle multi-carrier signals typical of communication systems like GSM.

It will be appreciated by those of ordinary skill in the art that this invention can be embodied in other specific forms without departing from its essential character. The embodiments described above should therefore be considered in all respects to be illustrative and not restrictive.

We claim:

1. An apparatus in a receiver in a communication system for selectively increasing the signal power level of a received desired signal, the apparatus comprising:

an amplifier having an adjustable gain that amplifies signals received by the receiver including the desired signal, an interfering signal that interferes with the desired signal, and thermal noise, the amplifier having a fixed dynamic range that is substantially less than 100 dB;

an analog to digital (A/D) converter that processes a signal derived from an output of the amplifier to produce a digitized signal;

a gain control unit coupled to the amplifier in a feedback configuration, said gain control unit receiving the digitized signal from the A/D converter and providing a feedback control signal to the amplifier that selectively positions the fixed dynamic range of the amplifier by adjusting the amplifier gain based on a signal power level of the received signals, said gain control unit controlling the amplifier to attenuate the received signals when the signal power level of the interfering signal causes the signal power level of the received signals to exceed a level that the A/D converter can process; and means for adjusting, in response to the gain control unit selectively positioning the fixed dynamic range of the amplifier, the transmit power of a transmitter in the communication system transmitting the desired signal, whereby the received signal power level of the desired signal is selectively increased in relation to the interfering signal and the thermal noise.

2. The apparatus of claim 1, wherein the gain control unit controls the amplifier to attenuate the received signals to a level at which the A/D converter can process the received signals without imperfections.

3. The apparatus of claim 1, further comprising a recalculation unit coupled to the A/D converter that recalculates an original received signal power level based on an output signal from the A/D converter and the adjustable gain of the amplifier.

4. The apparatus of claim 1, wherein the fixed dynamic range of the amplifier is within the range of 30 dB to 50 dB.

5. The apparatus of claim 1, wherein the amplifier has upper and lower thresholds that guide the positioning of the fixed dynamic range by the gain control unit.

6. The apparatus of claim 5, wherein the gain control unit positions the fixed dynamic range in increments according to time durations that an output of the A/D converter crosses the upper and lower thresholds.

7. The apparatus of claim 1 further comprising:

a quality detector that further adjusts the transmit power of the transmitter transmitting the desired signal based on quality measurements of the desired signal.

8. The apparatus of claim 1, wherein the transmit power of the transmitter is adjusted in response to the selective positioning of the fixed dynamic range of the amplifier to at least maintain a carrier to interference ratio for the desired signal equal to a carrier to interference ratio present just prior to the selective positioning of the fixed dynamic range of the amplifier.

9. In a cellular radio telephone system having a base station and a plurality of mobile stations, a method of processing received signals in the base station to selectively increase the signal power level of a received desired signal, the method comprising the steps of:

receiving signals at the base station, the received signals including the desired signal, an interfering signal that interferes with the desired signal, and thermal noise;

amplifying the received signals using an amplifier having an adjustable gain and a fixed dynamic range that is substantially less than 100 dB;

converting the amplified signals to digital signals;

selectively positioning the fixed dynamic range of the amplifier by adjusting the amplifier gain based on a signal power level of the received signals, said step of adjusting the amplifier gain including attenuating the received signals when the signal power level of the interfering signal causes the signal power level of the received signals to exceed a level that can be converted to digital signals without imperfections; and adjusting the transmit power of a transmitter in the telephone system transmitting the desired signal in response to the selective positioning of the fixed dynamic range of the amplifier.

10. The method of claim 9, further comprising the step of supplying the digital signals to a gain control unit that is operatively connected between an analog to digital (A/D) converter and the amplifier.

11. The method of claim 9, further comprising the step of supplying the digital signals to a recalculation unit that recalculates an original received signal power level based on the digital signals and the adjustable gain of the amplifier.

12. The method of claim 9, wherein the fixed dynamic range of the amplifier is between 30 dB and 50 dB.

13. The method of claim 9, further comprising the step of:

further adjusting the transmit power of the transmitter transmitting the desired signal based on quality measurements of the desired signal.

14. The method of claim 9, wherein the transmit power of the transmitter is adjusted in response to the selective positioning of the fixed dynamic range of the amplifier to at least maintain a carrier to interference ratio for the desired signal equal to a carrier to interference ratio present just prior to the selective positioning of the fixed dynamic range of the amplifier.

15. In a cellular radio telephone system having a base station and a plurality of mobile stations, a method of processing received signals in the base station to selectively increase the signal power level of a received desired signal, the method comprising the steps of:

receiving the desired signal from a mobile station operating in a transmit power control loop that includes a receiver in the base station;

receiving a disturbing signal from a transmitter having a transmit power level that is not coordinated with a transmit power level of the mobile station;

selectively positioning a dynamic range of the receiver in a manner that reduces the received signal power of the desired signal and the disturbing signal; and adjusting the transmit power level of the mobile station transmitting the desired signal in response to the selective positioning of the dynamic range of the receiver to at least maintain a carrier to interference ratio for the desired signal in the receiver equal to a carrier to interference ratio present just prior to the selective positioning of the dynamic range of the receiver.

16. The method of claim 15, further comprising the step of further selectively positioning the dynamic range of the receiver in a manner that accounts for the adjusted transmit power level of the mobile station.

17. The method of claim 15, wherein the dynamic range of the receiver is substantially less than 100 dB and can be moved through a range of substantially 80 dB.

18. The method of claim 15, wherein the dynamic range of the amplifier is moved in predetermined increments based on comparisons to at least one threshold of a signal derived from the received signal.

19. The method of claim 15, further comprising the step of:

further adjusting the transmit power of the mobile station based on quality measurements of the desired signal.

20. A communication system, comprising:

a receiver having a fixed dynamic range that is substantially less than 100 dB;

a transmitter that sends a desired communication signal to the receiver;

a gain control unit in the receiver that selectively positions the dynamic range of the receiver when at least one of a signal power level of the desired communication signal at the receiver and a signal power level of a disturbing communication signal at the receiver exceeds the fixed dynamic range of the receiver; and means for adjusting, in response to the gain control unit selectively positioning the fixed dynamic range of the receiver, a transmit power level of the transmitter that sends the desired communication signal based on power levels of the desired communication signal and the other disturbing communication signal at the receiver.

21. The communication system of claim 20, wherein the fixed dynamic range is selectively moved in a range of at least about 80 dB.

22. The communication system of claim 21, wherein the fixed dynamic range is within the range of 30 dB to 50 dB.

23. The communication system of claim 22, wherein the receiver has upper and lower thresholds that guide the movement of the fixed dynamic range by the gain control unit.

24. The communication system of claim 20, further comprising:

a quality detector that further adjusts the transmit power of the desired communication signal based on quality measurements of the desired communication signal.

25. The communication system of claim 20, wherein the transmit power of the desired communication signal is adjusted in response to the selective positioning of the fixed dynamic range of the amplifier to at least maintain a carrier to interference ratio for the desired communication signal equal to a carrier to interference ratio present just prior to the selective positioning of the fixed dynamic range of the amplifier.

* * * * *